US006112136A

United States Patent [19]
Paul et al.

[11] Patent Number: 6,112,136
[45] Date of Patent: Aug. 29, 2000

[54] SOFTWARE MANAGEMENT OF AN INTELLIGENT POWER CONDITIONER WITH BACKUP SYSTEM OPTION EMPLOYING TREND ANALYSIS FOR EARLY PREDICTION OF AC POWER LINE FAILURE

[76] Inventors: Steven J. Paul, 510 Township Rd., Camp Douglas, Wis. 54618; Michael W. Hogan, 602 Indian Mound Rd., New Lisbon, Wis. 53950; Teresa A. Kamper, 134 Oak Circle Dr., Camp Douglas, Wis. 54618; Gregory C. Kohls, 8978 Holz La., Nekoosa, Wis. 54457

[21] Appl. No.: 09/079,298

[22] Filed: May 12, 1998

[51] Int. Cl.⁷ ................................................. G05D 11/00
[52] U.S. Cl. ........................................... 700/293; 700/294
[58] Field of Search ................................... 700/291–295, 700/297; 713/340

[56] References Cited

U.S. PATENT DOCUMENTS

| | | |
|---|---|---|
| 3,573,605 | 9/1971 | Hart . |
| 3,573,606 | 4/1971 | Hart . |
| 3,579,088 | 5/1971 | Fletcher . |
| 3,590,362 | 1/1971 | Kakales . |
| 3,611,116 | 10/1971 | Balian . |
| 3,875,493 | 4/1975 | Kunzinger . |
| 3,965,408 | 6/1976 | Higuchi et al. . |
| 3,988,662 | 10/1976 | Hunter . |
| 4,142,141 | 2/1979 | Hase . |
| 4,242,630 | 12/1980 | Szpakowski . |
| 4,429,366 | 1/1984 | Kennon ................................... 364/482 |
| 4,439,722 | 3/1984 | Budnick . |
| 4,465,966 | 8/1984 | Long et al. . |
| 4,558,275 | 12/1985 | Borowy et al. ........................... 324/103 |
| 4,654,806 | 3/1987 | Poyser et al. ............................ 364/551 |
| 4,692,854 | 9/1997 | Baxter et al. . |
| 4,975,649 | 12/1990 | Bosry . |
| 4,991,105 | 2/1991 | Pimental ................................. 364/483 |
| 5,170,359 | 12/1992 | Sax et al. ................................. 364/481 |
| 5,229,651 | 7/1993 | Baxter, Jr. et al. ........................ 307/66 |
| 5,351,181 | 9/1994 | Brennan et al. . |
| 5,483,463 | 1/1996 | Qin et al. . |
| 5,602,462 | 2/1997 | Stich et al. .............................. 323/258 |
| 5,619,077 | 4/1997 | Green et al. .............................. 307/64 |
| 5,781,448 | 7/1998 | Nakamura et al. ....................... 364/492 |
| 5,808,902 | 9/1998 | Levert et al. ............................ 364/492 |

*Primary Examiner*—Joseph E. Palys
*Assistant Examiner*—Robert G. Crockett
*Attorney, Agent, or Firm*—Murray Leonard

[57] ABSTRACT

A software management system of an intelligent power conditioner with backup system option employing trend analysis for early prediction of AC power line failure. An AC line power conditioner utilizing a microprocessor based control system for providing suitable alarms when an operating input AC line is defective or the trend of measured deficiencies predicts line power failure and for initiating an inverter control signal when an inverter module is attached as an option. The software controlled system analyzes the input and output voltages, provides analysis of input voltage surges and sags, measures transient amplitude and transient pulse width, counts glitches and dropouts, measures frequency, and identifies each defect and computes associated trends, stores all accumulated data in a Log Buffer for digital printout, and then provides appropriate alarms to a user. These alarms advise the user of imminent power failure and the need for an inverter module, if an inverter module, which can be attached by simple plug in, has not been attached thereto. If an inverter is unconnected, the addition of an inverter is suggested when defects are excessive, or when the trend indicates a higher than normal predilection to failure. A connected inverter module is activated when line defects prescribe such operation.

9 Claims, 10 Drawing Sheets

SOFTWARE MANAGEMENT OF AN INTELLIGENT POWER CONDITIONER WITH BACKUP SYSTEM OPTION EMPLOYING TREND ANALYSIS FOR EARLY PREDICTION OF AC POWER LINE FAILURE

TECHNICAL FIELD

This invention relates to the field of power protection for sensitive electronic equipment, and specifically to devices such as power conditioners, line conditioners, Uninterruptible power supplies (UPS) and the like. In the prior art these devices operate approximately instantly by responding to abnormalities which exist in the power mains such as outages, glitches, transients and other identified defects.

Under software control, the power protection system of the present invention measures and detects both small and large electrical anomalies on the Alternating Current (AC) input power mains. The system then stores and analyzes the trend of those measured defects, in a manner which determines that debilitating failures which have not yet occurred, are probable or imminent. The system described herein alerts the user that the observed defects exist, and activates a backup power inverter control when the incoming power is failing or about to fail. If no inverter is attached, specialized alarms are provided to show the end user that his power line is suffering from specific defects, and the date and time and magnitude of the defects are logged.

BACKGROUND ART

The need for power protection is not new. It has long been known that even simple fluctuations of electrical line voltage can have disastrous results on attached electrical equipment. It is known that an electrical light bulb can fail if the operating voltage exceeds the prescribed limits. For example, a ten percent increase in line voltage can reduce the filament life of a common light bulb by half. Increasing the AC line voltage from 120 volts to 144 volts can reduce the design life of an electric bulb from 750 hours to less than 200 hours. Voltage sags and surges, are but one of the problems that must be eliminated. Other serious defects include, but are not limited to voltage spikes and transients, glitches, dropouts (prolonged glitches), and electrical noise. An interesting case which illustrates these problems is reported to have occurred at General Motors. A computer controlled vehicle painting system was in operation, painting a new car Blue. Suddenly, about halfway through the process, the paint color changed ro Red. An investigation revealed that a welder on the same power line was causing transients on the power line. These transients affected the attached painting computer and caused it to switch colors out of sequence.

Early Power Protection Devices

In order to solve the problem of line voltage surges and sags, Sola invented the constant voltage transformer in 1938 (U.S. Pat. No. 2,136,895). This magnetic device could reduce voltage fluctuations of plus and minus twenty percent to a low value of plus and minus two percent, resulting in immediate industrial savings of hundreds of thousands of dollars by simply extending the operating life of light bulbs which were in use as street and industrial lighting. As science progressed, heavy current consuming devices were added to the power lines, and the quality of electrical power became worse Elevators and heavy lighting loads caused the power lines to fluctuate badly. Connection of inductive loads such as motors and electromagnets caused the electrical power mains to develop transients of several thousands of volts when these loads were turned on and off. Power distribution management by electrical provider companies has necessitated the installation of relays which transfer power from one power distribution grid to another.

As these relays transfer power, there is an interruption or break of power whose duration can be from a fraction of a cycle to several cycles. (one cycle of a 60 cycle AC voltage source is equal to 16.6 milliseconds). Welders or other electrical equipments on the AC line can cause severe electrical noise to occur, and the effects of lightning are often extremely severe. A lightning strike which occurs twenty miles away from a factory or home can induce electrical transients on the power line which are sufficient to damage or destroy electrical equipment. A nearby lightning strike can induce voltages in the order of 8,000 volts and thousands of amperes in the electrical power system of a home or factory.

Recent Developments

In recent years, the power quality has become aggravated by the increased use of computers, television sets, VCR's, and other extremely sensitive electronic equipment. Many of these equipments are used in industry, in medical applications, and in the home. A new industry has evolved specifically to provide reliable and efficient methods of power protection. Standards have been established which define the allowable disturbances that can exist on the power lines. Some classes of modern electronic equipment have been modified to withstand a specific level of power disturbance without erratic operation. This requirement, promulgated by by the Computer Business Equipment Manufacturers Association, is known as the CBEMA curve.

The most prevalent type of power protection device in use today is the Uninterruptible Power Supply (UPS). The line fault detection systems are relatively simple, these devices respond to failures on the power mains, and almost immediately transfer to battery backup wherein a battery powers an inverter which creates an artificial AC voltage (often square waves) to provide power to the attached equipment. These UPS products often operate unnecessarily, depleting the batteries when the line defect is small. In addition, many line defects are of such short duration, that the use of an inverter is not necessary.

It is an object of the present invention to correct these difficulties by providing a control system which does not react to small line voltage abnormalities, but rather, accumulates the data over a specified time, analyzes the trend of the line changes, and then predicts the probability or imminence of power line failures.

Supplementary Information Relevant to the Present Invention

The constant voltage transformer which was developed by Mr. Sola, although simple and functional, was very primitive. Input energy, measured as volt-amperes was fairly constant over most of the load range. This meant that when a small load was connected to the Sola Constant Voltage Transformer, the transformer consumed almost as many volt-amperes, with a power factor approaching unity, as when the full rated load was connected. This represented an inefficiency which was costly to the user, and which caused the transformer to overheat.

Modem Ferroresonant transformer technology, spearheaded by such companies as Best Power Technology, in the 1980's and 1990's, have improved the original Sola design, and have created a new breed of constant voltage transformers which are more efficient, and whose input power was proportional to the load volt-amperes. These new types of Ferroresonant transformers provide isolation and excellent protection against the effects of lightning transients, glitches, noise, and fluctuating line voltage.

These specialized magnetic devices could provide excellent voltage regulation, and they could accept a lightning strike of more than 8000 volts without damage, and then reduce the voltage surge which reaches the sensitive equipment attached thereto, to three volts or less.

The Ferrorersonant transformer has formed the basis for a nearly ideal, but simple, power conditioner, manufactured by Best Power technology, Necedah Wisconsin, under the trade names of FERRUPS and CITADEL.

In addition to its phenomenal isolation properties, the Ferroresonant transformer also has the ability to store electrical energy and provide power to the connected load during a short power outage, keeping the load fully powered during the momentary disruption of power.

These bursts of energy which can be supplied by the Ferroresonant transformer can be as long as twenty milliseconds under full load conditions, in the event of a complete power failure. Power line dropouts caused by relay transfer, usually in the ten to fifteen millisecond range, will not pass through the Ferroresonant based power conditioner. The magnetic energy which is stored in the "tank circuit" will power the output during the relay transfers, or power breaks, keeping the flow of power to the critical load smooth, continuous, and sinusoidal.

Prior art UPS products, and in particular, Ferroresonant based UPS products examine the incoming line for defects, and when predefined defects occur, the inverter system is automatically turned on, thus providing a measure of power protection which is automatic.

A major defect in the present UPS art is that the incoming power line must absolutely be plagued with defects or anomalies which can cause equipment failure before the UPS can function and provide auxiliary power to the critical load. Many non-ferroresonant power conditioners can pass the line anomalies directly to the critical load.

The instant invention does not rely on power failure to operate. Instead the continuously measured defects, as data, are stored and then are analyzed in a "Trend Analyzer", and it becomes possible to predict that the AC line, while not failed at the time of measurement, will most likely experience a predicted or imminent failure.

The use of the Ferroresonant transformer, in cooperation with the instant invention, fulfills the need for an ideal power conditioner. When coupled with an inverter module, a nearly perfect UPS is created. It is important to realize that the operation of the present invention is not dependent upon they type of power conditioner or inverter attached thereto, however, the use of the Ferroresonant transformer represents the Best Mode for the present invention. The present invention is a system for analyzing and computing the trend of potential line failures. The ferroresonant transformer is not claimed as part of the instant invention, but its use therein represents the best mode of application of the instant invention.

Unfortunately, Ferroresonant transformers are heavy, large, and costly to produce. In an attempt to produce a less costly power conditioner, attempts to eliminate the Ferroresonant transformer by using conventional linear transformers and inductors in combination with relays which switched the taps on the transformer in order to achieve a crude form of voltage regulation, were tried. These methods were only partially successful.

The conventional linear transformer, however, lacked the isolating and voltage regulation characteristic of the Ferroresonant transformer, and large voltage spikes or transients could pass through the linear transformers with very little attenuation. Slowly, despite the proven advantages of the Ferroresonant transformer, the power protection industry has moved away from the device, simply to reduce costs.

Combinations of inductors, capacitors, transformers, thyrectors, relays, and semiconductor invertors have been used in an effort to produce less expensive power protection devices which can protect sensitive power equipment such as computers, medical equipment and the like.

These less costly protection devices met with very limited success. Many contained an input relay whose operating coil was connected across the input power line. When the AC power fails, the relay will drop out, disconnecting the inverter from the line and connecting a local battery to the inverter circuit. These simple systems, often called a "Standby UPS" did not provide the type of power protection that industry and the home required. Many of these inexpensive "power protection" devices produced square waves instead of sine waves as the protected power. These square wave devices often provided their own break in the flow of power during transfer from line to battery operation, or from battery back to line. These breaks in power flow ranged from four to 22 milliseconds, and sometimes longer.

Standards were developed by The IEEE Std. 446-1995, (and others) to prescribe the minimum level of power protection that could be provided and still offer "adequate" protection. As the devices for power protection were made smaller, and cheaper, the amount of protection that they could provide also diminished. This was considered to be an acceptable alternative, but the change in direction was not very good for the end user. In general, the user who purchased one of these smaller, cheaper, power protection devices was deprived of essential protection, without his knowledge. The user was never aware of the totality of the actual AC line deficiencies. Except for the total loss of power, there was no way for him to know what was happening to the power lines, and he could not determine if his protection device was properly installed or whether the power conditioner was sufficient to protect the attached expensive equipment. The only indicator that the user had was his equipment failure, and by then it was too late.

Despite the reduction in performance, the efforts to reduce weight and cost, have resulted in simpler power protection devices. Some very simple "power protection devices" consist of only a thyrector type of energy absorber which is connected in parallel with the power line. The surge protector device is not a line power conditioner at all. Many of these power protection systems, often called "Surge Protectors", and many less expensive power conditioners as well, allow the low side of the A.C. power line, or "neutral conductor" to directly pass through from the A.C. mains to the protected load, greatly reducing the amount of protection that was actually provided.

Some of these cheaper systems allow as much as thirty to fifty volts of "pass-through" voltage to impinge upon the computer or sensitive electronic devices. This level of pass through voltage, (thirty to fifty volts), can cause a computer or medical system to fail or to be damaged, often permanently. Recognizing these serious defects, isolation transformers, DC to DC conversion, and extensive filtering have been used to minimize the problem of voltage transient pass-through on the low side of the line.

These methods of filtering have been successful, but the added cost became comparable to the cost of the Ferroresonant transformer type of line conditioner.

By re-introducing the necessity for an isolation transformer, the obvious advantage of size and weight of the smaller power conditioners has been lost. Time and technology has proven that there is no combination of devices that can duplicate the Ferroresonant transformer as a power conditioner-isolation device. One often unrecognized feature of the Ferroresonant transformer is its low bandwidth.

This important feature prevents electrical noise which may be generated within the attached equipment from passing back to the power line.

The Present Inventive Entity

Many line conditioners and power conditioners have been developed to protect critical equipment from power line disturbances. These devices, upon recognizing the existence of a major fault on the AC lines immediately revert to inverter operation.

Many of these devices perform very effectively, providing a flow of continuous uninterrupted power to the critical load. One major problem still exists, a debilitating fault must occur before the system is operable.

The point of novelty of the present invention is the ability to recognize AC line faults, both small and large, measure am and quantify them, store the data, and analyze the measured results for type of disturbance, repetition, frequency, amplitude, and duration. Trend analysis circuitry and software stores the accumulated failure data and computes the potential for failure, alerting the user that, where necessary, an inverter module is required to permanently solve the line power problems that have been encountered. A complete log of the measured defects, their duration, date and time is printed out for the user, and the data can also be seen on a connected video display. The invention described herein can also be applied to DC (Direct Current) power systems.

Another unique feature of the present invention is that in many cases, an inverter module is not required because the defects seen on the lines are trivial, and well within the capability of the Ferroresonant transformer or other type of power conditioner to provide the required power protection. It is only when the trend analysis reveals that conditions continuously or repeatedly exist on the power lines which can lead to failure, that an inverter module should be used.

The major element and novelty of the present invention is a software control process which determines the overall protective operation of the new power conditioner.

Note that the terminology "line conditioner" and "power conditioner" as used herein are synonymous. Both terms are used equally in the power protection industry.

Under software control, the present invention measures and detects the following line deficiencies:

A) Line transients: Peak pulse amplitude and pulse width, time of day, and duration are measured. The system accumulates data and then analyses the trend of the transients. If the trend indicates a potential line failure, an inverter should be attached, an alarm is sounded. Alarms can be visual or audible, and a voice module advises the user that the connection of an inverter module is suggested. If an inverter is attached, the system will automatically revert to inverter operation.

B) Line voltage glitches are measured within each cycle of input voltage and detected and counted. An allowable number of glitches is entered as a "glitch count" (N). At the glitch count number that has been entered, minus 1 (N−1), an alarm is sounded indicating that there are a dangerous number of glitches occurring on the power mains. At the preset number of glitches (N), the system reverts to inverter operation. If no inverter is attached, the system sounds an alarm at (N−1 glitches), advising the user that an inverter is necessary. In addition, the system counts glitches per timing interval, and analyzes the trend of the glitches that are occurring. If the glitch count is rising, an alarm is sounded indicating that the trend depicts imminent line failure. During normal operation, glitches are counted within a line cycle. (16.6 milliseconds at 60 Hz), but the invention allows the glitch count period or interval to be seconds, minutes, hours, days, weeks, or months, as desired. The variable timing interval is a wonderful diagnostic tool. Of course, as the time is extended, the number of glitch counts is increased accordingly.

At three glitch counts per cycle, the same limits are computed to be:

| Per cycle | 3 |
| Per second | 180 |
| Per minute | 4800 |
| Per hour | 288,000 |

It is not expected that long duration glitch counts will be tolerated, and glitch counts are generally measured during a single cycle or on a per second basis to predict the potential for failure. Other defects such as transients, line voltage excursions, noise, dropouts, can be measured and stored over the specified intervals.

C) Surges and sags of incoming line voltage are measured and data is stored. The system must provide constant voltage to the attached load. Under software control, the system measures all surges and sags of the input voltage. Data is stored and analyzed. The trend is analyzed and the user is alerted when the trend predicts possible line failure, or potential damage to attached equipment.

D) Incoming line frequency is measured. Upper and Lower acceptable limits of frequency are pre-programmed by the operator or under software control. This is an important feature which is overlooked on simple, less-expensive power protection systems. When the power protection device is used with an automatic gasoline generator, diesel generator, or a wind or water powered electrical system, measurement of incoming frequency is of great importance. When the out-of-frequency detector determines that the incoming frequency is out of limits or is apt to go out of the specified limits, the system reverts to inverter operation. Appropriate alarms and readouts are activated.

Inverter operation provides a frequency which is more accurate and stable than the power lines from the power company. Precise frequency to the critical load is therefore guaranteed.

Fortunately, most power disturbances persist for extremely short durations. If these transients are allowed to appear in the attached electronic equipment, they can and do produce stresses on the electrical circuits. These disturbances and induced stresses may not cause instant failure. They can initiate a process which can result in early failure of the attached equipment. These failures can prove to be extremely costly. If there was a way of knowing the extent and duration of line transients and voltage excursions, the expected lifetime, or prediction of future failure can be accurately determined.

The software of the present invention satisfies the requirement for failure prediction through a process of trend analysis of all measured line defects.

With today's expensive and sophisticated equipment, it is no longer adequate to simply protect the critical load from line voltage anomalies at the instant that they occur. Prediction of possible line failure, and of expected life service become of paramount importance. The ability to predict potential or real failure of a computer controlled system may be more valuable than the cost of the protection equipment. The most novel feature of the present invention is the use of microprocessors and computer technology to measure the AC power line defects which are described above, and to analyze the duration and frequency of these events. The software then analyzes the occurrences, integrating them over time. The software process also predicts whether the line is experiencing an excessive number of defects, and whether the measured defects are increasing or decreasing with time. The trend analyzer then alerts the operator that he is apt to have a failure due to the measured defective characteristics, and suggests the addition of an inverter and battery system, if required. The software can also control the Ferroresonant transformer regulation, improving its overall operating efficiency, and reducing its' output impedance.

The software also can provide the user with a complete printed record of the AC line conditions in his home or factory installation, improving the ability to diagnose power faults and correct them. Line transients, dropouts, surges, sags, electrical noise, incoming frequency, and short term outages are recorded automatically. The measured defects, the quantity and the time and date are provided to the user in an operating log format. The logged data is stored in a buffer which can be downloaded to a digital printer or a video display upon demand or at a pre-programmed time. The reporting interval and format is selectable by the user as per cycle, per second, per minute, hourly, daily, weekly, or monthly.

Where the line sag exceeds the capability of the controlled Ferroresonant transformer, or other power protection device, to provide active compensation, and to provide power during a break in the input, or where other line defects exist, the user is alerted and measured data is transferred into the Log Buffer. Where conditions of power quality are extremely bad, the system can inhibit the attached electrical equipment operation. The user will then have the option of adding a plug-in battery and inverter option which converts the line conditioner of the instant invention into a true no-break Uninterruptible Power Supply. (UPS)

It is well documented that more than 95% of power outages are of very short duration. These outages last for four milliseconds or less. With a properly designed Ferroresonant power conditioner, the battery backup (Inverter) option often becomes unnecessary, and the inclusion of the battery backup option becomes an unnecessary expense. The battery backup option should be used only when the application calls for it. Non-Ferroresonant power conditioners often employ large capacitor banks to provide the necessary "ride through", so that inserters are not necessary for short transient outages.

When an inverter is connected, the power conditioner will provide battery charging and battery management. The present invention keeps track of outages, totalizes them, and advises the user when to add the battery backup or inverter option. This option is often called a UPS option. The same trend analysis circuits and logs can be configured to keep track of battery drain and be used to control the battery charger in order to maintain optimum battery life.

The present invention allows the inverter option (or UPS) to be an independent entity, and one which can be attached by means of a simple plug-in assembly. By adding this option only when necessary, this invention saves on the additional cost, and the UPS function will be utilized only when needed. In many cases, a battery backup UPS has proven not to be necessary. The improved voltage regulation, isolation, transient protection, and power carry-through, provided by a properly designed Ferroresonant transformer, is all the protection that is needed. It is important to note that when a non-ferroresonant power conditioner is used, a type which is not able to "ride through" a 20 millisecond outage, the battery backup option becomes essential.

In addition to improved power conditioning, and data collection and reporting, this invention defines and fulfills the need for accurate data collection, improved power management, improved efficiency and economy, and power line defect trend analysis. The algorithm of the instant invention solves many of the heretofore known problems associated with the Ferroresonant transformer and other battery powered inverter type line conditioners. Operating efficiency is increased, size and weight are reduced, and initial installation cost is reduced, and interconnectivity or paralleling of Ferroresonant transformers without excessive circulating currents has been achieved.

PRIOR ART

There are literally hundreds of patents which are applicable to the present power protection device. Patents which are representative of the art employed in the hardware section of this invention include, but are not limited to those indicated herein. These include ferroresonant transformers and their variants, voltage regulating systems, and other types of invertors and UPS products are included by reference. The sampling shown herein represents the best choice of prior art, but those patents not included in this listing may be considered included herein by reference. This invention does not claim any of these prior art hardware examples as an inventive entity. The present invention is dependent upon the development of the measurement and control software, not found in the referenced inventive entities. The power conditioner described herein cannot function as designed without the software of the instant invention.

Examples of Prior Art Include

U.S. Pat. No. 3,579,088 Ferroresonant transformer with controllable flux. Issued to Fletcher on May 18, 1971. U.S. Pat. No. 4,142,141 Ferroresonant REGULATING CIRCUIT, issued to Alfred Hase on Feb. 27, 1979. U.S. Pat. No. 4,692,854 METHOD AND APPARATUS FOR MODULATING PULSE WIDTH. Issued to Baxter et al, Sept. 8, 1997. U.S. Pat. No. 3,611,116 Ferroresonant VOLTAGE REGULATOR WITH SATURABLE AND UNSATURABLE TRANSFORMERS, issued to Balian, Oct. 5, 1971.

U.S. Pat. No. 4,242,630, Ferroresonant VOLTAGE REGULATOR. issued to Szpakowski et al, on Dec. 30, 1980. U.S. Pat. No. 5,483,463 UNINTERRUPTIBLE POWER SUPPLY AND METHOD. Issued to Quin et al. On Jan. 9,1996. U.S. Pat. No. 3,988,662 VARIABLE FLUX RESET Ferroresonant VOLTAGE REGULATOR, Issued to Hunter on Oct. 26, 1976. U.S. Pat. No. 3,573,605 CLOSED LOOP Ferroresonant REGULATOR. Issued to Harry Hart Apr. 6, 1971. U.S. Pat. No. 3,573,606 CLOSED LOOP Ferroresonant VOLTAGE REGULATOR WHICH SIMULATES CORE SATURATION. Issued to Harry Hart, Apr. 6, 1971.

U.S. Pat. No. 3,590,362 DC TO DC CONVERTER CIRCUIT. issued to R. Kakalec on Jan. 29, 1971. U.S. Pat. No. 4,439,722 Ferroresonant POWER SUPPLY STABILIZER CIRCUIT FOR AVOIDING SUSTAINED OSCILLATIONS. Issued to B. J. Budnick on Mar. 27, 1984.

U.S. Pat. No. 4,465,966 CONTROLLED Ferroresonant VOLTAGE REGULATOR PROVIDING IMMUNITY FROM SUSTAINED OSCILLATIONS, issued to J. F. Long et al. On Aug. 14, 1984 U.S. Pat. No. 5,351,178 ACTIVE POWER LINE CONDITIONER WITH A DERIVED LOAD CURRENT FUNDAMENTAL SIGNAL FOR FAST DYNAMIC RESPONSE. Issued to Brennan et al. On Sep. 27, 1994. U.S. Pat. No. 5,384,696 ACTIVE POWER LINE CONDITIONER WITH FUNDAMENTAL NEGATIVE SEQUENCE COMPENSATION, issued to Moran et al. On Jan. 24, 1995.

U.S. Pat. No. 3,965,408 CONTROLLED Ferroresonant TRANSFORMER REGULATED POWER SUPPLY. Issued to Higuchi et al. On Jun. 22, 1976. U.S. Pat. No. 4,030,025 Ferroresonant REGULATOR WITH SUPPLEMENTARY REGULATION THROUGH WAVEFORM CONTROL. Issued to Kaskalec on Jun. 14, 1977. U.S. Pat. No. 3,875,493 Ferroresonant POWER CONVERTER WITH CONTROL OF INVERTER FREQUENCY AND SENSING OF SATURATION CONDITION. Issued to Kunzinger et al. On Apr. 1, 1975. U.S. Pat. No. 4,975,649 METHOD AND APPARATUS FOR SENSING LOSS OF REGULATION IN A Ferroresonant TRANSFORMER. Issued to Bobry on Dec. 4, 1990. U.S. Pat. No. 5,351,181 LOW COST ACTIVE POWER LINE CONDITIONER. Issued to Brennan et al. On Sep. 27, 1994.

DISCLOSURE OF THE INVENTION

Alternating Current (AC) line power conditioners and Uninterruptible power systems of various descriptions have existed for many years. Many different configurations and technologies have been employed. The most primitive power conditioners are simply "surge protectors" which consist of Thyrector type of energy absorbers which conduct when a line voltage transient exceeds a pre determined amount, usually 350 volts for a 120 volt RMS AC line. A better version of this type of power conditioner adds series inductors, shunt capacitors, as well as the thyrector. Gas filled devices have been designed to replace the thyrector, which has a very limited capability for energy absorption.

Since the peak voltage of a 120 volt RMS AC line is 169.68 volts, a clipping voltage of 350 volts leaves no margin for error, and provides very little protection.

Other power conditioner designs are capable of supplementing the flow of power to the critical load when the input AC power line has a very short-term disturbance. In the prior art, an actual power failure, or excessive number of glitches is required to activate the UPS operation. In the instant invention, actual line failure is not required. Trend analysis of the measured defects predicts the potential for AC power line failure, long before actual failure occurs, and the trend alerts the user that the potential for line failure exists. This trend can initiate inverter action, or if no inverter is attached, alert the user that the addition of an inverter is prudent.

The best mode embodiment of the present invention employs a Ferroresonant transformer as the preferred power flow control medium in the power conditioner. The Ferroresonant transformer technology is well known in the art and has been successfully employed by several UPS manufacturers. One such manufacturer has been Best Power Technology, Necedah Wis., in their FERRUPS line of Uninterruptible Power Systems. (UPS), and the CITADEL line of Ferroresonant power conditioners.

The best mode power conditioner of the present invention utilizes a prior art Ferroresonant transformer as the power flow regulator. It is noted that any line conditioner topology can be used with the present invention. The use of the ferroresonant transformer is exemplified as the best mode because of its superior line conditioning properties. These very specialized transformers provide voltage regulation, 120 DB of primary to secondary isolation, protection from high voltage transients or spikes on the AC mains, reduction or elimination of line voltage surges and sags, and protection against complete loss of power for a period which is typically 20 milliseconds under full power conditions.

As the load power requirement is reduced, the duration of the power "carry over" is increased. When used in an Uninterruptible Power Supply configuration (UPS), the addition of an inverter winding to the Ferroresonant transformer core provides sinusoidal output directly from square wave switching with a Total Harmonic Distortion (THD) of approximately 5%. The Ferroresonant transformer provides load regulation with decreasing battery voltage, and a relatively low impedance output.

The Ferroresonant transformer itself, and standard regulating circuits are well known in the art, and are not claimed herein as part of the instant invention. This invention relates solely to the manner in which the software measures defects on the AC input mains, stores and analyzes the trend of that data, and then alerts the user and activates the inverter control when the incoming power is failing or about to fail.

If no inverter is attached, specialized alarms are provided to show the end user that his line is suffering from specifically identified defects, the date and time of the defect and if unconnected, an inverter is suggested. The product provides for a readily connected plug-in inverter module which can be installed by the user in the field.

If the inverter is attached, the system alerts the user that there is a defect, stores the date, time, and magnitude of the defect, and sounds an alarm. The system also provides a digital printout of all data, and generates a voice message indicating a potential for line failure or an imminent line failure. It is recognized by those skilled in the art that although the Ferroresonant transformer is depicted as the preferred embodiment of the inverter module, this invention can be used with any inverter or device which is to be activated when the AC power lines are beginning to fail.

The most important feature of the instant invention is the ability to measure, store, and analyze power line faults, determine the trend of the measured faults, and alert the operator that the measured defects indicate that a major power line failure is imminent, and that the user should add an inverter option. This feature enables the power conditioner to become a full-featured Uninterruptible Power Supply (UPS). Moreover, this feature enables the user to purchase the power conditioner without the inverter option, thus effecting an economy. In many instances, the Ferroresonant power conditioner is adequate to provide protection against known power anomalies, and the addition of the inverter module is not necessary.

The system performs the following functions: A presettable counter determines if a complete test is to be performed hourly, daily, weekly, or monthly. The hourly position is an excellent tool for diagnosing difficulties with the AC mains and verifying the performance of the power conditioner. The nominal setting for standard performance is "daily". The glitch count, which is exercised on a cycle by cycle basis, remains constant unless pre-programmed otherwise. What is measured:

A). AC Input

1. Is input AC present? Yes or No.—is the Power Conditioner switch on-off. If switch is on, and no voltage is present, Report status. If an inverter is attached, go to inverter operation instantly. If no inverter is present, sound alarm. Show inverter operation; time on, time off, and duration. Record date, time on, and duration, the time voltage was lost and the magnitude of the deviation from normal. If the AC line fails or suffers from detectable losses which predict failure, an appropriate line failure alarm is actuated, and all data is entered into the Log Buffer for printout or visual display.

2. Line RMS voltage monitoring. Measure Volts High (Surges), measure Volts Low. (Sags)—Develop history: determine trends. Determine if an inverter is required. Alert user.

Store data Voltage magnitude, date, time, duration, frequency of changes.

If line voltage is greater than upper limit, go to inverter.

If line voltage is less than lower limit, go to inverter.

If line voltage is within range, monitor power conditioner output

Store input line voltage, output voltage, analyze data develop control feedback.

for regulation. Store all data.

Measure VOLTS OUT, convert to a DC analog voltage. Compare this voltage against a reference which is electrically equal to 120 volts RMS but appropriately scaled. (e.g. 12 volts) And provide feedback to the electronically controlled Ferroresonant transformer, whose output voltage has been identically scaled by a resistive voltage divider.

For the sake of brevity, 120 volts RMS has been used as both the input voltage and the output voltage of the described system. It must be realized by those skilled in the art, that a transformer can be wound for any operating voltage. Systems can be designed for 120 volts, 240 volts, 480 volts in or out in any combination. Said voltage being related to the number of turns of wire on the primary, secondary, or tank winding, as is known to those skilled in the art of transformer design. The core can also contain auxiliary windings such as an inverter winding, a battery charging winding, and others, as may be required, and the battery charger may be a separate unit, without changing the spirit of the inventive entity.

3. Glitch count—Detect momentary dropouts or small power line bi-directional transients. Measure duration, develop history, store data, analyze, examine trends, determine if an inverter is required, alert user.

If glitch count per cycle or test interval exceeds limit set (usually three during a line cycle), alert the user, and then transfer alarm data into the Log Buffer.

If an Inverter is attached, initiate inverter.

If glitch count approaches but does not exceed the lower limit, (usually 2), alert user that an inverter may be needed. No Inverter attached? Do not Initiate inverter.

Initiating inverter automatically disconnects the incoming AC line.

4. Transients capture, sample and hold peak voltage. Transient analysis—develop history. Measure transient peak voltage, transient duration, date and time, and frequency of events.

Does the trend analyzer indicate that there are excessive transients, and the rate of increase is increasing, then initiate Inverter required alarm.

Inverter attached? Initiate inverter

Store data—Inverter control, to Log Buffer for printout or display.

5. Analysis of events (Input RMS voltage)

Analyze input voltage history, Store data, date and time,

Trend: is Input voltage falling?

If trend reveals that voltage is crawling toward upper or lower limits, advise, sound alarms alert the user that inverter an inverter is needed. Transfer all data to the Log Buffer for digital printout or Video display.

6. Analyze dropouts

Examine all stored data.

Trend: Average dropouts increasing?

Trend: Average dropout interval increasing?

Trend: Average dropouts decreasing?

Trend: average dropout interval decreasing?

If trend reveals that dropouts are increasing alert user that an inverter will be required. Some power conditioners supplement line power during disturbances by providing interactive power during a short power failure.

7. Analyze transients

Store data: are the number of transients per interval increasing?

Are the number of transients per interval decreasing?

Is the Transient amplitude increasing?

Is the Transient interval decreasing?

Perform the Trend Analysis.

If transient amplitude is increasing, or the transient repetition rate is increasing, advise the user that a problem exists. The use of an inverter may not be necessary.

8. Determine whether a battery powered UPS function is needed This requirement is fulfilled by the present invention. Trend analysis of measured defects is a useful tool in predicting when or that a major failure will occur.

9. Reporting method

A) Digital printout of detected failures which had been entered into the Log Buffer.

B) CRT (video monitor) readout of detected failures, which had been entered into the Log Buffer.

C) Provide Audio (Speech Dialog) of the identified problem areas when the trend analyzer reveals potential for power line failure. Normal failures are revealed by audible and visual alarms.

10. Select data interval

Select the standard data interval for reporting defects in power as:

Hourly, daily, weekly or monthly. Standard is Daily. In addition, Weekly, Monthly, are user selectable.

Diagnostic: Hourly, minute, second, or cyclic. This function disables the Standard intervals.

Although this invention has been shown and described with respect to detailed embodiments thereof, it will be appreciated and understood by those skilled in the art that various changes in form and detail thereof may be made without departing from the spirit and scope of the claimed invention. The invention may be used with other systems which depend upon failure detection of the power mains, and the determination of those trends which predict potential failure.

BRIEF DESCRIPTION OF THE DRAWINGS

Generally, functional diagrams for logic systems have been presented as "flow diagrams". These flow diagrams indicate the simplified interaction of the many elements which make up the system. Unfortunately, flow diagrams often become so complex that they become totally incomprehensible to other design engineers who are not familiar with the precise specifics of the system. In this application, therefore, conventional block diagrams have been used to present the functional operating elements in a manner in which almost anyone can readily understand.

Drawings

Figure 1:
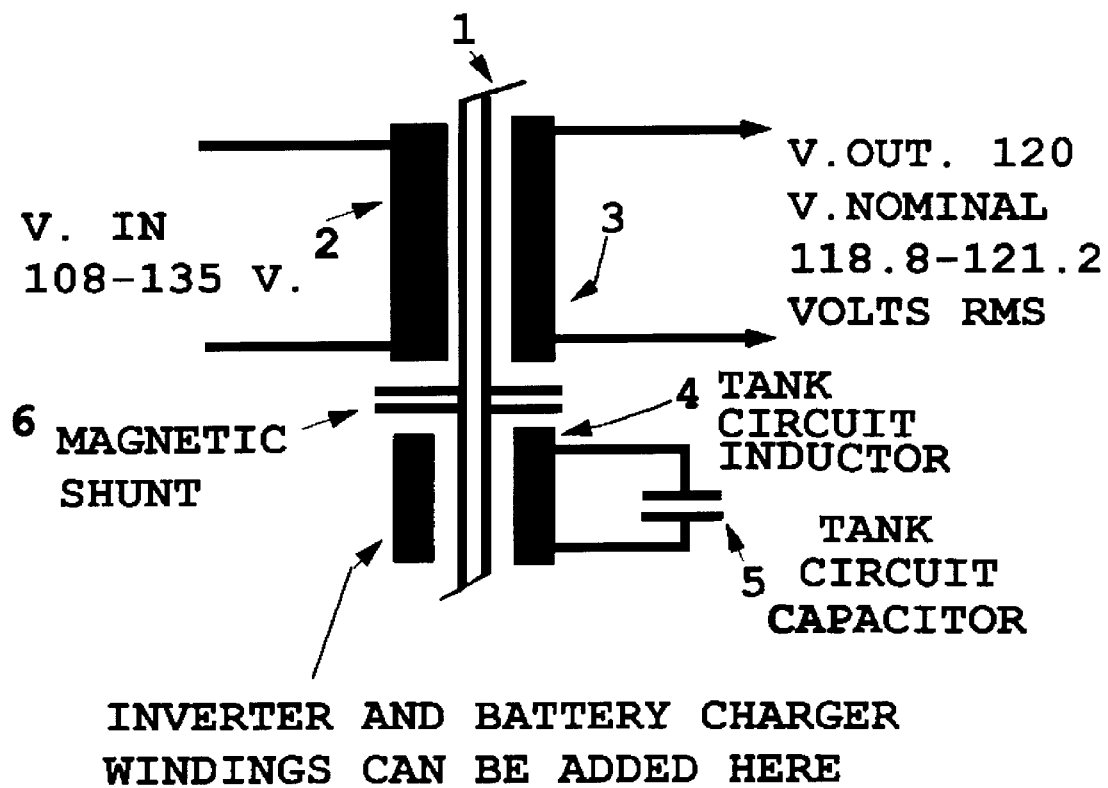
FIG. 1 shows a typical prior art Ferroresonant power transformer—based line conditioner. This type of transformer can be used directly in a power conditioner or line conditioner. Such a conditioner provides regulated voltage output, lightning protection, protection against sags and surges, isolation, and protection against dropouts of power for intervals as large as 20 milliseconds.

Where the ferroresonant transformer is required to function as a UPS, an inverter winding and a battery charging winding can be included in the region shown on the transformer core, as illustrated in FIG. 1.

Figure 2:
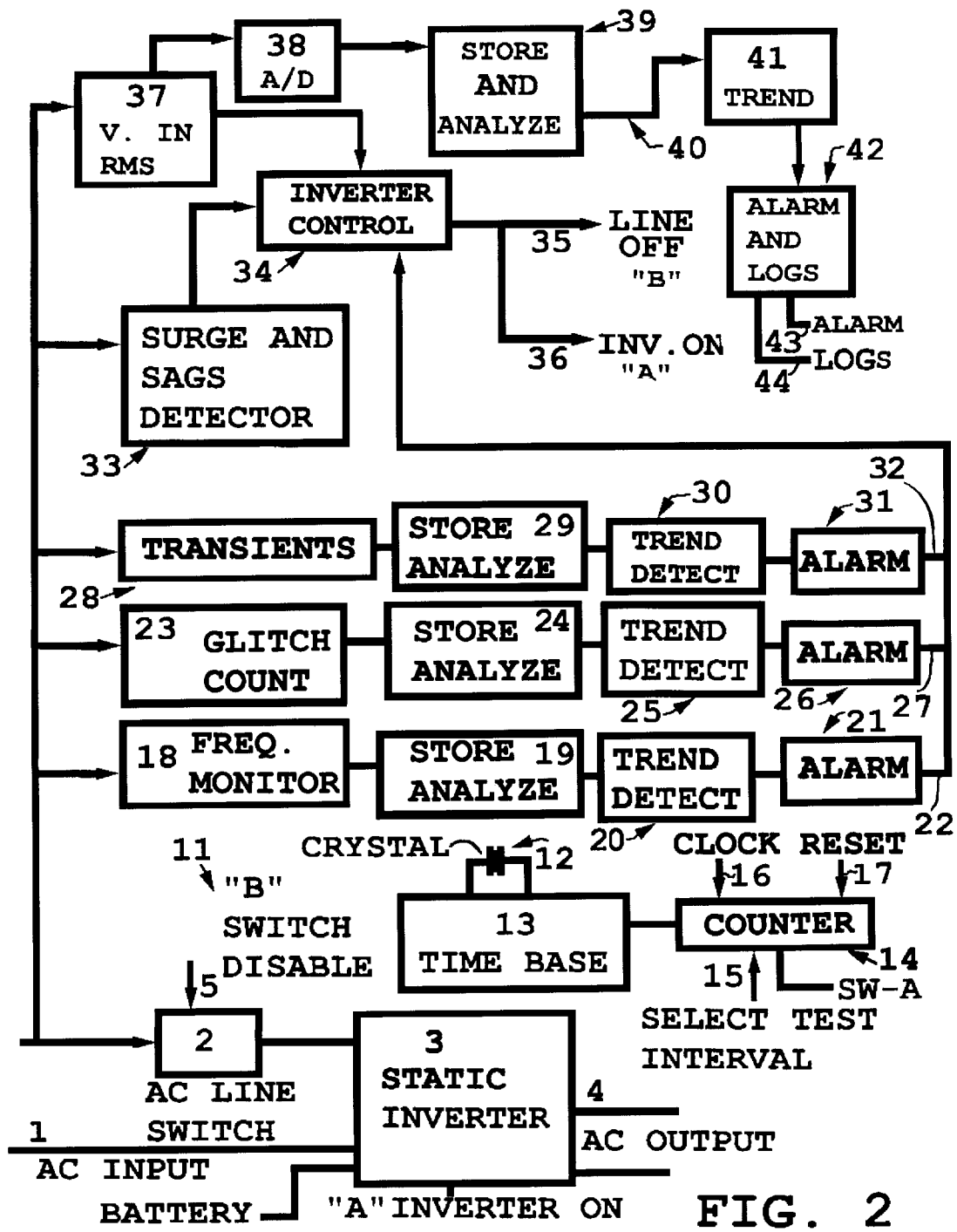

FIG. 2 shows the overall basic system of the present invention. Several attributes are measured. These include RMS Input voltage, RMS output voltage, Transient Detection, glitches, dropouts, surges and sags of the input voltage, and Incoming Frequency. All data is stored, analyzed, and the trend of each of these attributes is determined. When the trend predicts any potential failure of the incoming AC line, an alarm is sounded, and the operator is alerted of the impending failure, and the type. Accumulated data, including the type of failure, time, date, and duration is entered into the system Log Buffer. The system log can be printed out upon demand, showing the defects that have been noted, the time of day, and duration of each event. Also included in the alarm system is a visual alarm, an audible alarm, a pre-recorded voice message, a digital printout and a video display of the stored data log.

In many applications, the power conditioner is used with a gasoline or diesel powered generator. These generators generally have poor frequency V.s. load characteristics. When the incoming frequency is out of bounds, the inverter is automatically actuated, assuring that the critical load attached to the system has the proper operating frequency at all times. When protection for frequency variation is required, an inverter must be connected to the system of the present invention.

Figure 3:
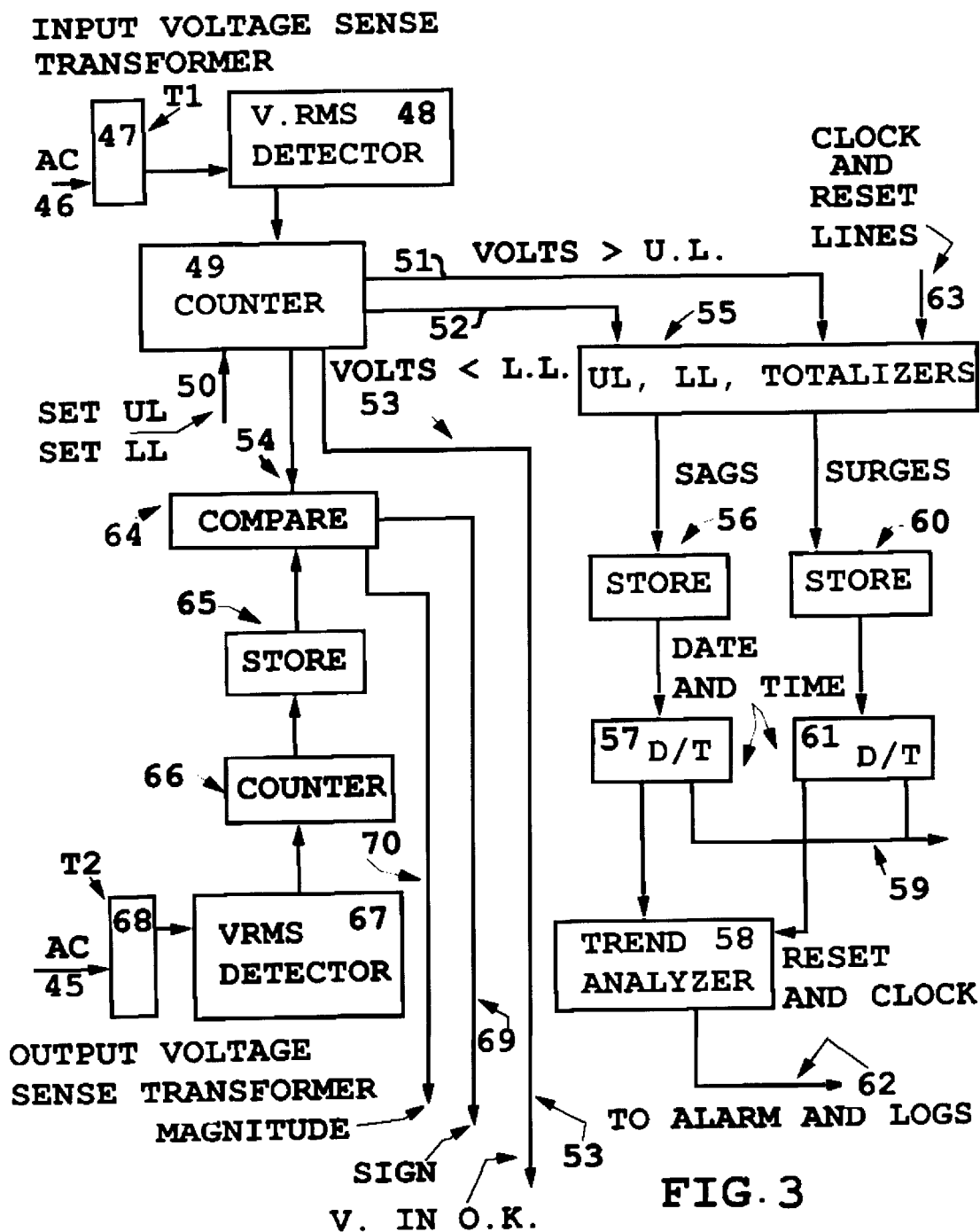

FIG. 3 depicts the circuitry of the limit detectors.

Figure 4:
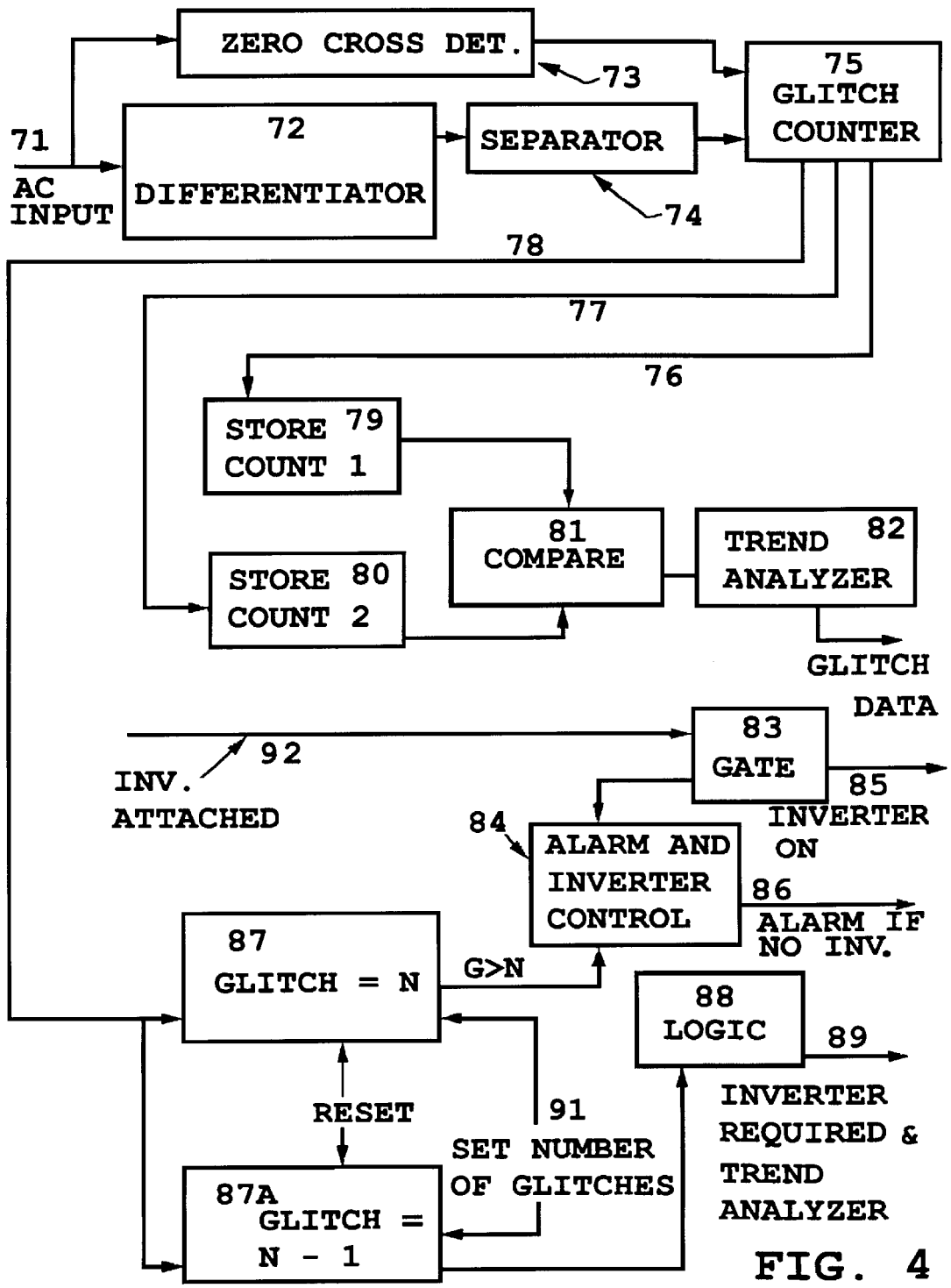

FIG. 4 shows the glitch detectors in the system. A glitch is a small transient which may be a short dropout of power or a disturbance typified by relay breaks or the connection or disconnection of inductive loads in the power line system.

Figure 5:
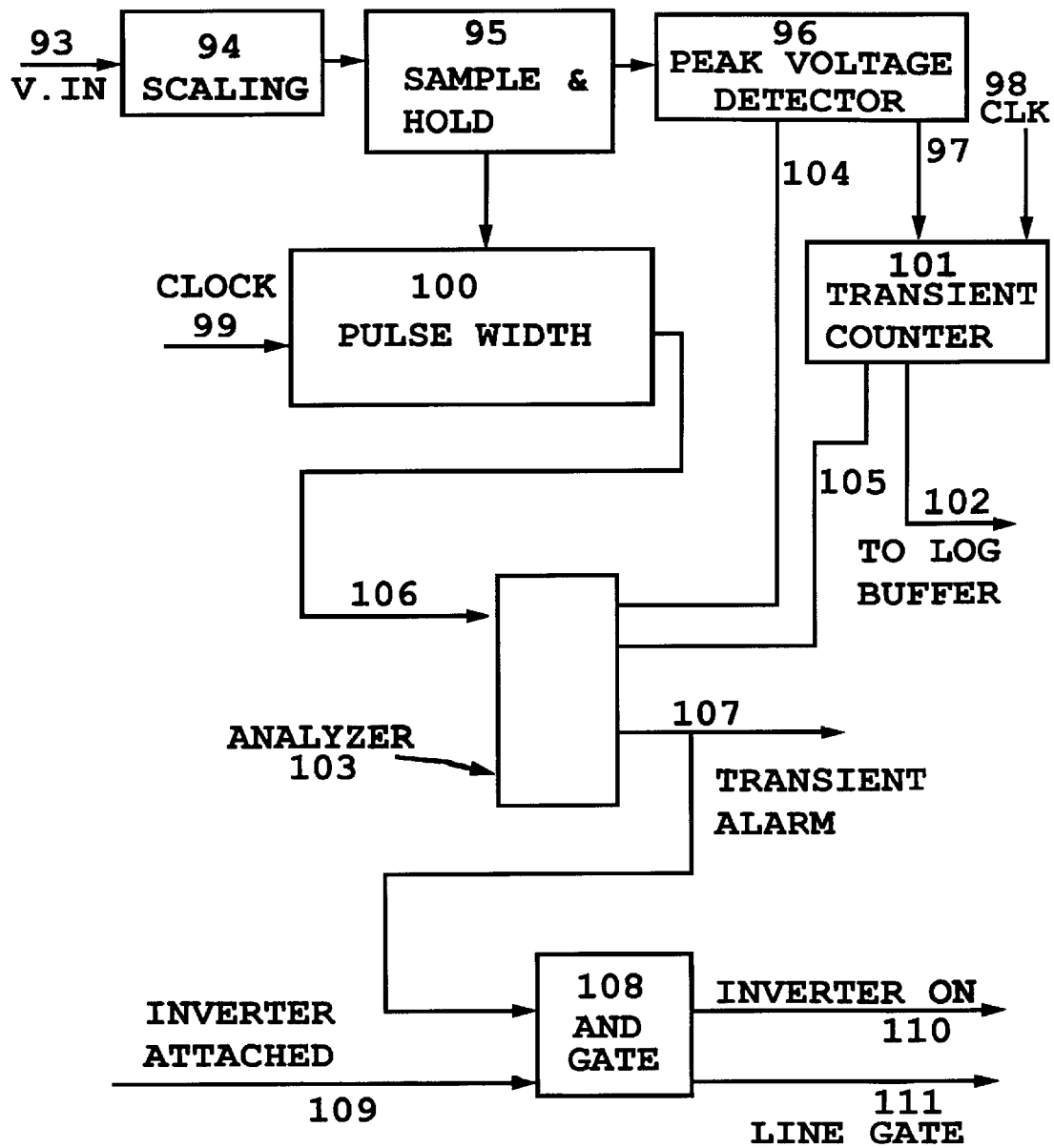

FIG. 5 is the circuit which detects AC line transients. The incoming line is scaled and connected to a peak detector and sample and hold circuit. Here, the scaled peak voltage is stored. The peak voltage transient data and transient pulse width is measured, accumulated data is stored, and analyzed. Excessive transient amplitude or transient duration sounds the alarm and initiates the inverter if it is attached. If no inverter is attached, the inverter needed alarm is sounded. Data is transferred to the system Log Buffer for printout and/or video display.

Figure 6:
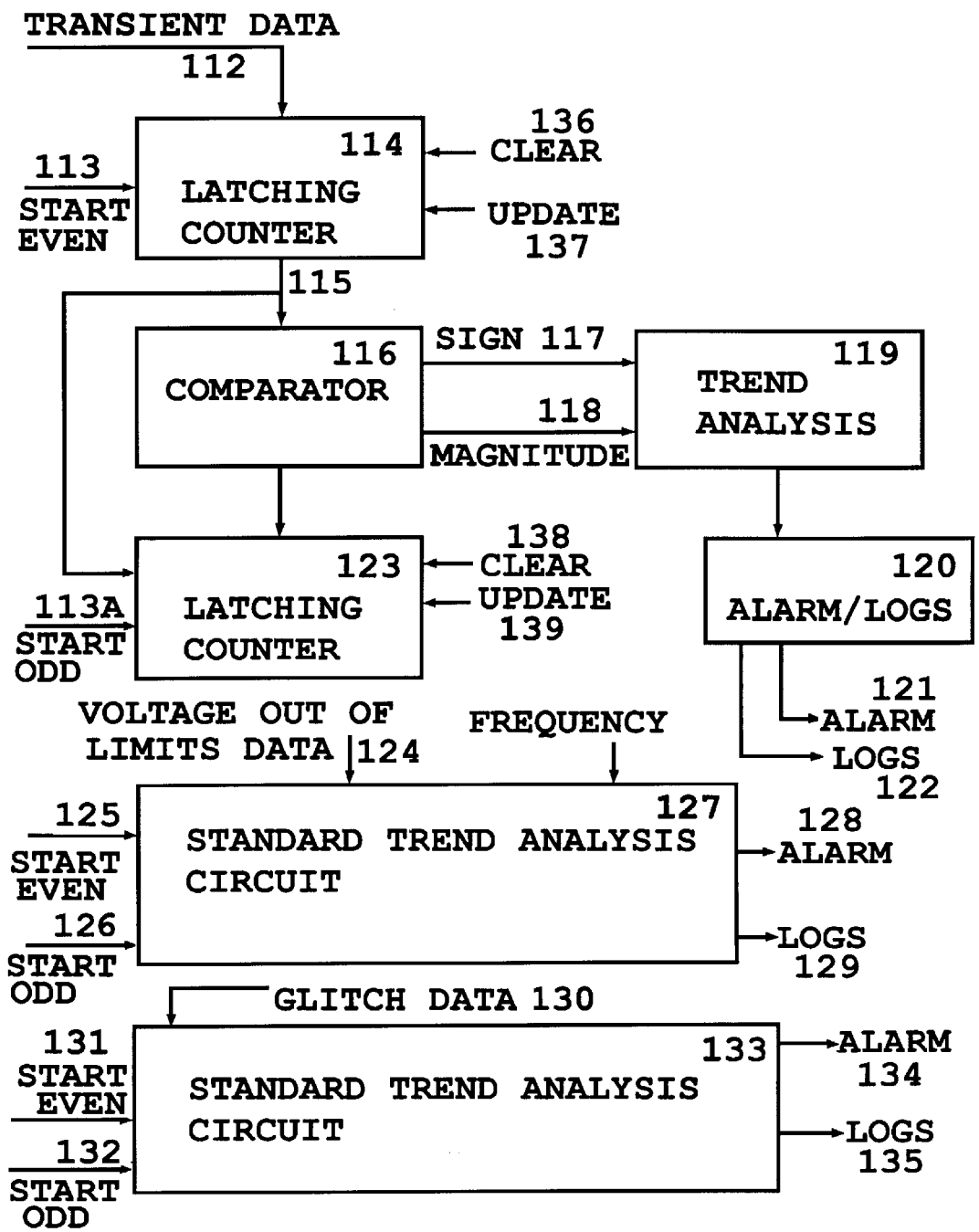

FIG. 6 shows the trend analysis circuitry for the transient analysis, for the Glitch data, and for the input voltage out-of-limits data. All data is transferred to the Log Buffer memory and to the alarm circuitry actuator.

Figure 7:
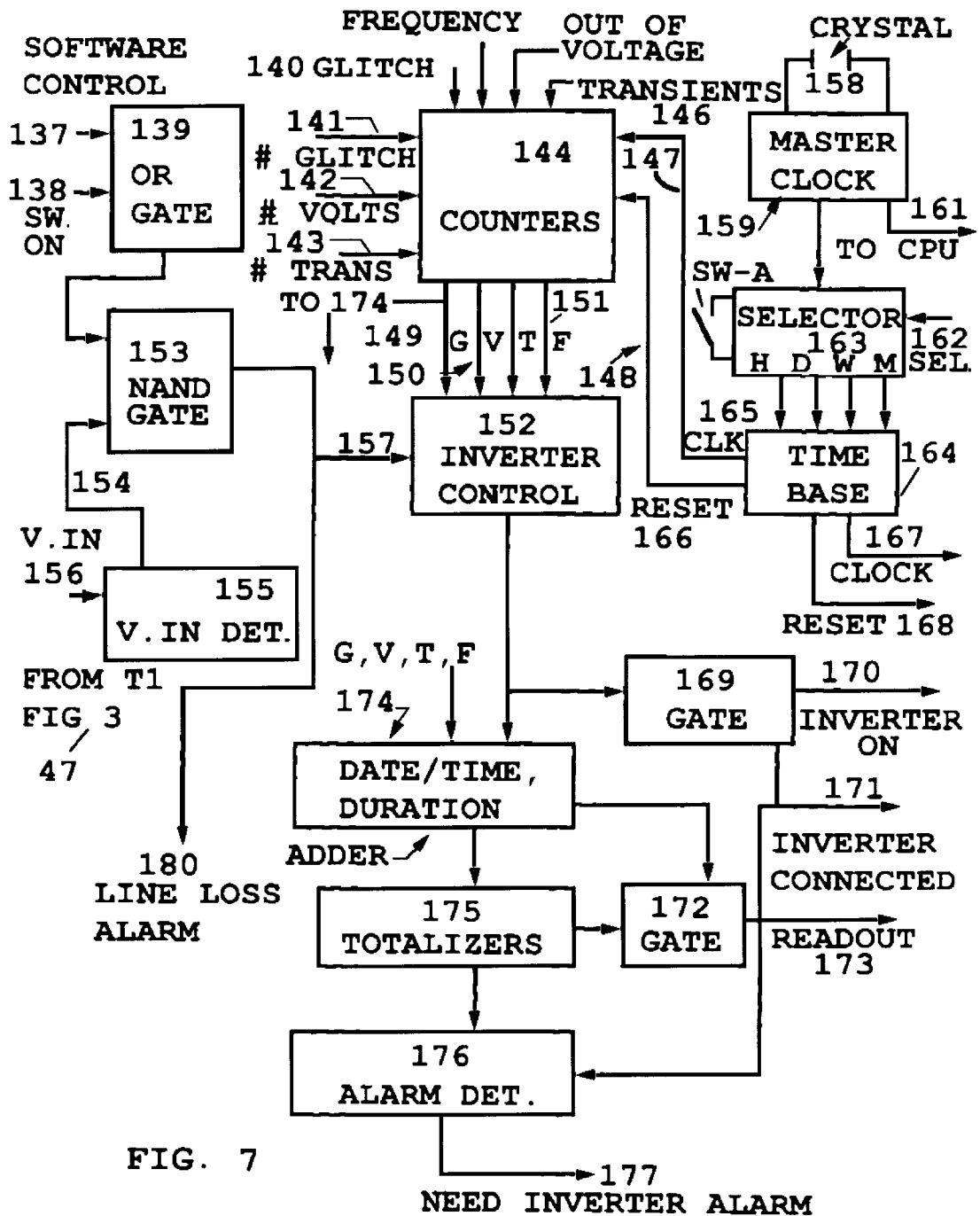

FIG. 7 This diagram depicts the control logic elements which initiate the inverter when the AC line drops out. For clarity and ease of comprehension, the time base, shown in FIG. 2 is duplicated in the diagram.

Figure 8:
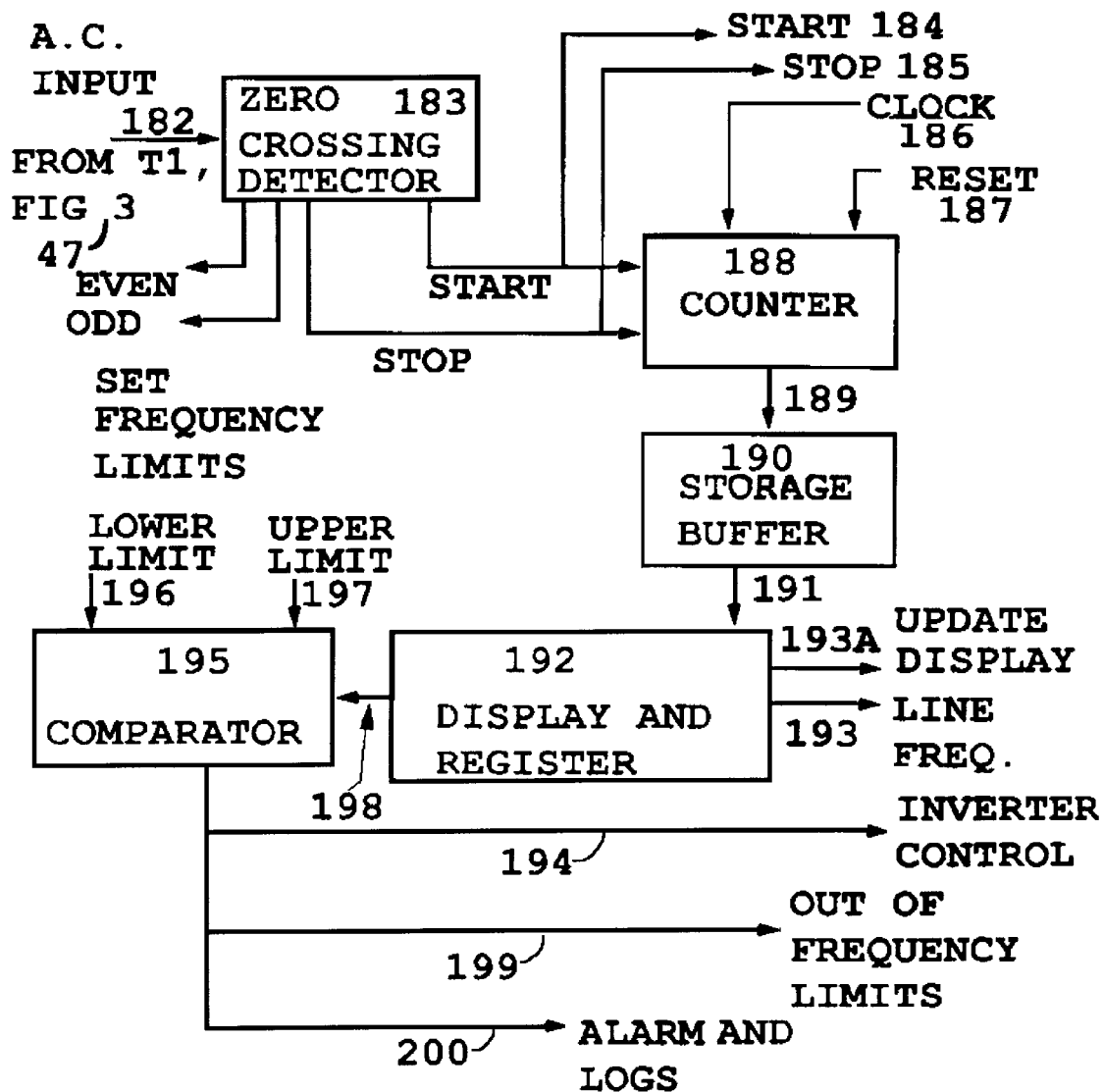

FIG. 8. This diagram shows the line input voltage zero crossing detector and the technique for measuring input frequency.

Figure 9:
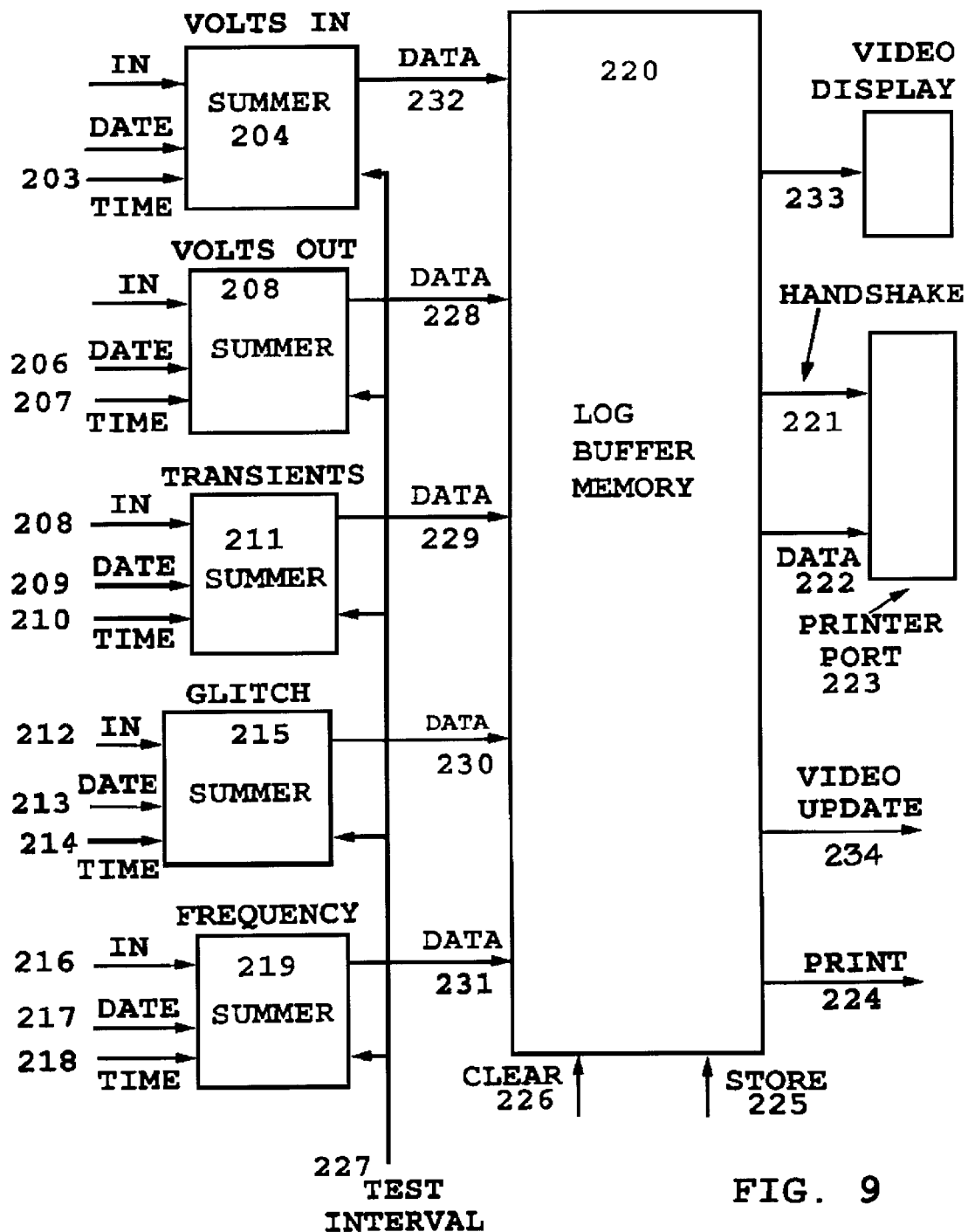

FIG. 9 shows a series of Log Buffers. These storage elements receive alarm data from the computer and store the results in a large buffer.

Figure 10:
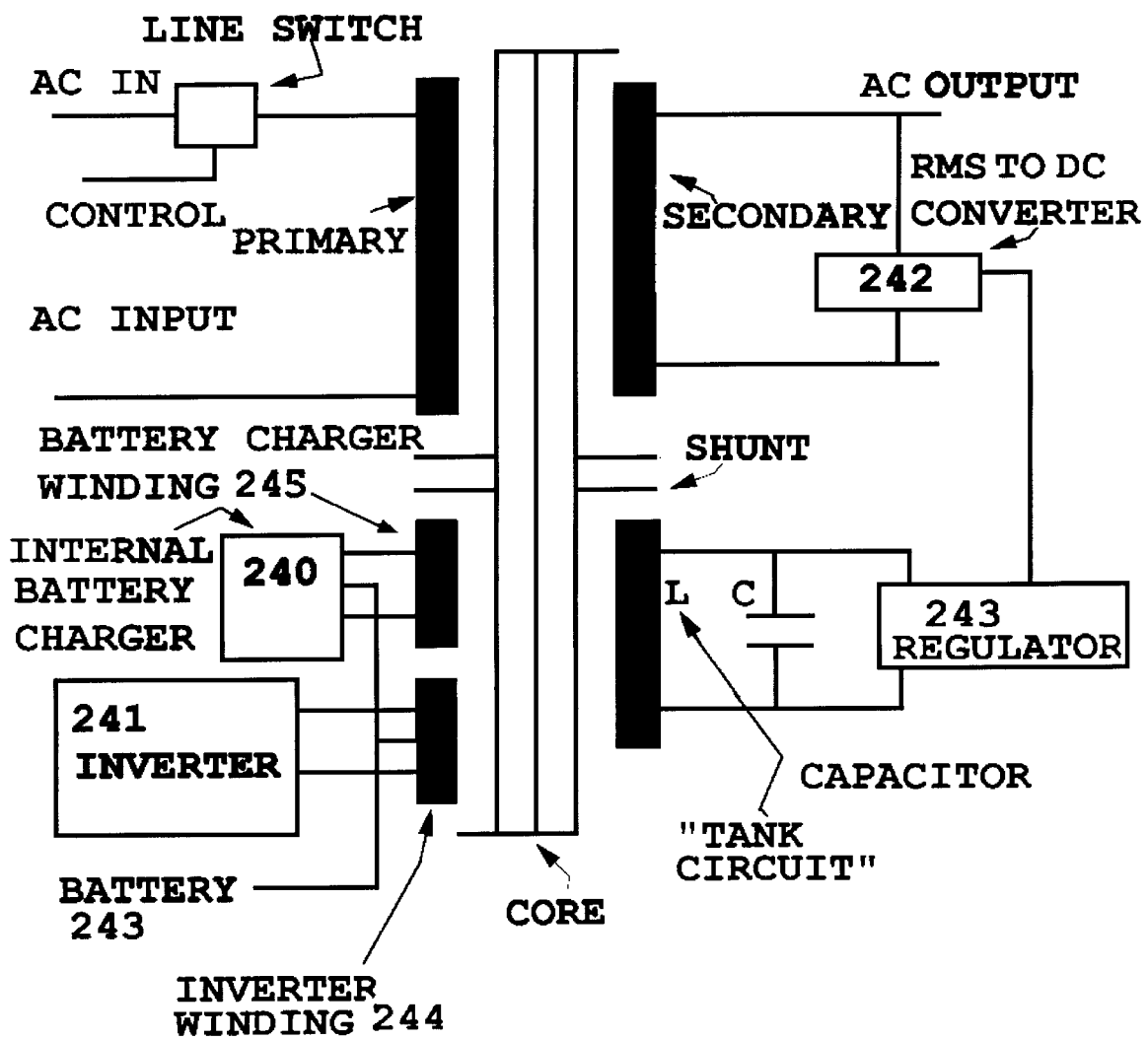

FIG. 10 shows the preferred power conditioner and inverter circuit, using a Ferroresonant transformer. It is important to realize that any type of inverter-power conditioner may be used in the present invention, with variations in performance.

BEST MODE FOR CARRYING OUT THE INVENTION

For the sake of clarity, and as the preferred mode, the basic power conditioning device in the present invention is portrayed as a Ferroresonant transformer. It is important to note that a Ferroresonant transformer is not an essential element which is required for the instant invention to work. The ferroresonant transformer is simply used to exemplify the best mode for carrying out the present invention. Any kind of power conditioner system including but not limited to standby systems, line interactive systems, double conversion systems and the like, with or without an attached inverter may be used. This invention, however, can be used wherever monitoring of the power mains, and the prediction of potential failure of those power mains is required. The invention described herein pertains to the collection of many kinds electrical disturbance data; storage of said data, and trend analysis of the resulting stored information. Data is date and time stamped, and stored for readout in the system Log Buffer, which can be accessed by the user. The contents of the Log Buffer can be printed out on a digital printer or displayed on a video monitor. When the accumulated data trend analysis reveals a potential for line failure or too much noise, or disturbances which are near or outside of prescribed limits, an alarm is provided to the user. Where no inverter is attached, the alarms also indicate that the attachment of an inverter is desired. If the inverter module has been attached, the alarm control activates the inverter, thus providing clean and regulated output power when the input power is failing or fails.

Due to the complexity of the microprocessor programming, and the difficulties which result when the comprehension of the software is attempted. The typical logical flow diagram, with boxes and triangles, has been dispensed with as being too complex for the average person to comprehend. In its place, conventional block diagrams are used to identify the functional blocks of the system. Simplified block diagrams have been indicated in FIGS. 2 through 10. When following the attached figures, keep in mind that the operations depicted in the figures are performed by one or more Central Processing Units (CPU).

The operations depicted herein have been sectionalized into "functional blocks" for easier comprehension. Such functional blocks do not physically exist as hardware. The functions they represent are vested in the system software. Common signals such as Reset and Clocking data have been shown on each diagram, to make the operation easy to understand.

FIG. 1 shows a basic Ferroresonant transformer line voltage regulator or power conditioner. Although not shown, the transformer core (1) contains a linear section where the primary winding (2) is wound. The inverter winding (7) section. Is also linear. The inverter winding section also contains a separate battery charger winding (7) which charges the battery when the transformer is powered by the AC mains. The core also contains a saturated section where the output winding (3) is located. Saturation current is controlled by the tank circuit winding (4). And the attached capacitor (5). The core is separated into a linear section and a saturated section by magnetic shunts (6).

An attached inverter, shown in FIG. 10, can be added to the core winding. The transformer can supply full power for 20 milliseconds and the attached inverter can come up to full power in two to three milliseconds, as a result, the transfer to battery operation is smooth, with no break in the continuity of electrical power flow to the attached load. The same section of the core can also contain a battery charging winding, if required. In some designs, a separate battery charger is used.

An AC primary winding (2), is wound on the linear section of the core. The secondary (or output) winding is wound on the saturated portion of the core. (3).

A tertiary winding (4) and parallel connected capacitor (5) comprise a tank circuit which stores circulating volt-amperes. The primary and secondary windings can be wound for any desired voltage.

The same transformer is also shown in FIG. 10, with the addition of the inverter winding, and a battery charger winding. The complete system also contains a battery charger (240) which obtains power from the added charger winding (245). The Ferroresonant transformer regulator circuit (243) and the output voltage detector and comparator. (242 )

Note that the Ferroresonant transformer has been depicted herein for informational purposes only, to better understand the present invention. This transformer is totally prior art and is depicted as a reference only.

The transformer has been designed so that the energy which is stored in the tank winding can power the full rated load for a limited time, usually about 20 milliseconds, in the event of input power failure.

FIG. 2 also depicts the overall system and reveals the fundamental measurement elements of the present invention. These measurements include, but are not limited to Measurement of input AC line RMS voltage (37), measurement of surges and sags of line voltage (33), count of line voltage glitches or dropouts (23), measurement of line voltage transients (28), and measurement of incoming frequency (18). Identical data analysis circuits (19,24,29, and 39) within the Central processing Unit (CPU) store data, analyze the data, determine trends, (20,25,30, and 41) and actuate appropriate alarms (21,26,31, and 42). The alarms can be visual, audible, or human speech. All alarm data is transferred into the Log Buffer for printout or video display. When the speech option is added, error messages include. But are not limited to:

1.) "Incoming Voltage too high. Suggest an inverter be added."
2.) "Incoming Voltage too low. Trend indicates imminent power failure Suggest an inverter be added."
3.) "There are excessive glitches on the AC line. Suggest an inverter be added."
4.) "Voltage transients of (measured voltage) volts have been measured. Trend indicates imminent failure. Suggest an inverter be added."
5.) "Incoming frequency has been varying over a range of (the measured value) Hz. Suggest an inverter be added."

If an inverter module has been attached, the system automatically reverts to inverter operation when any of these alarms are activated. The voice messages are modified to indicate imminent failure only.

Timing Data

A crystal controlled oscillator (13) provides timing data. The select test interval input to the counter (15) sets the interval clock rate as Hourly, Daily, Weekly, or Monthly.

This setting determines how often the Log Buffers are examined, and how long the data is accumulated. Setting the count interval to hourly, to minutes, seconds, or per line cycle is provided as a diagnostic tool. The standard setting is daily. The reset and clock outputs are applied as control inputs to all store-analyze circuits. The glitch and dropout counter detects the glitches or transients on a cycle to cycle basis.

FIG. 3, the limit detector circuitry, shows the input voltage RMS detectors. Since the circuit elements cannot handle the large voltage of the input line directly, a small broadband transformer T1 (46) provides voltage scaling. Typical scaling values are ten to one, step down, providing 12 volts RMS for a 120 volt RMS input voltage. Other ratios may be used as needed. This scaled input is applied to a RMS detector (48), which contains an A/D converter. The output is coupled into a digital counter (49) whose count represents the input voltage. The counter also has upper and lower limit values pre-programmed into the counter under software control (50). The output from the counter consists of two signal sets. The digital quantity which has been measured, representing the input voltage is fed into one input of a digital comparator (64) on line (54). Another output line from the counter (53) indicates when the incoming voltage is within the prescribed limits.

In a like manner, the system output voltage is scaled in T2 (45) and fed into an identical RMS detector with its A/D converter (67). And into a digital counter (66). Here the data is stored, and fed into the second input of the digital comparator (64). The output of the comparator is the difference between the input voltage and the output voltage. A magnitude signal (70) and a sign signal (69) are provided for system operation. The magnitude and sign are used as a feedback control for output voltage regulation.

The input voltage counter also transfers data into the totalizers (55). Here, the upper and lower limits of the AC voltage which are pre-programmed by the user or software are totalized. The surges are voltage excursions which exceed the upper limit (51), and the sag are voltage excursions which are lower than the lower limit (52), are fed into storage elements (56) and (60). Date and time information is added to the digital data stream (57) and (61). The data is analyzed in the trend analyzer (58), and the output of the analyzer is used to operate the alarms and Log Buffer (62). The totalizer is controlled by the system master clock and reset lines (63) which control the totalizer. Reset and clock signals (59) from the system master clock are used to reset the date and time stamp circuitry as required.

Glitch Detector

FIG. 4 shows the glitch detector. Glitches are small momentary excursions of the AC power line which can cause a computer to malfunction. Glitches can be positive directed, or negative directed. Many glitches are caused by electrical noise which is superimposed on the incoming power line voltage. The incoming AC line is scaled by a small broadband transformer, located in another part of the system.(FIG. 3, 40). A differentiator (71) and separator (72) isolates the glitch into a unipolar event.

The input voltage is also connected to a zero-crossing detector. This circuit samples the AC input voltage and produces a pulse when the voltage crosses zero volts, to assure that glitches are not measured near the zero crossing, where they are generally ineffective, and where their small amplitudes may seem inordinately high. For ease of reference, each successive zero crossing has been identified as "even", and "odd". Followed by "even", and "odd", and so on at each successive zero crossing of the AC power line voltage. The sequence of pulses defines the one-half and the complete cycle measurement interval. The output of the glitch counter is stored in counter (79). When the next zero crossing is detected, the data from counter (79) is moved into counter (80). The data in counters (79) and (80) are compared in digital comparator (81). The resulting differences are then connected into glitch trend analyzer (82). Dropouts of a few milliseconds are recognized as a glitch.

When the trend analyzer or number of glitches in a single cycle, indicates a possible failure, the inverter required alarm is activated. If an inverter option has been added, the glitch count is connected to a plurality of comparators. These comparators (87 and 87A) are preset to the number of glitches that can be allowed (typically three glitches in a line cycle). A separate comparator (87A) is set to one less than the desired number of glitches.

When the selected number of glitches is reached, logic elements (84) and (83) operate and an alarm is sounded, and the inverter is turned on. At one less than the acceptable number of glitches is reached, an inverter required alarm is activated. (88) If no inverter is connected (92), no inverter control signal (87) is generated. This prevents the input line from being disconnected from the system, and the Ferroresonant transformer is allowed to still provide regulated power to the critical load.

Transient Capture

FIG. 5 the transient capture circuit. The input voltage, scaled in down T1, (94) to be consistent with the operating voltages of the system, are applied to a sample and hold peak detector (96) where the peak voltage of the transient is measured. In addition, the pulse width of the interfering transient is measured and stored (100) in the analyzer (103). The magnitude passes through a set point limit (94) and thence into a transient counter. The transient count, pulse width, and amplitude which exceeds the set point are fed into an "OR'd" analyzer. The output is used to actuate the transient alarm. In addition, an inverter attached signal (109) is brought into the circuit. If there is an alarm, the inverter is turned on. The line gate (111) is turned off whenever the inverter is turned on (110). This gate disconnects the Ferroresonant transformer primary from the incoming line and prevents the inverter from feeding AC power back to the AC mains when the system detects a power failure or detects an anomaly which can disable the system.

Trend Analysis

The trend analysis circuits are is shown in FIG. 6. For the sake of brevity, the basic trend analyzer is for transient data is explained. Additional analysis circuits for Glitch data, and input voltage "out of limits" signals are accumulated in a latching counter (114). The circuit shown on the top of FIG. 6 is repeated for each input. Start "even" and start "odd" inputs are derived from the zero crossing detector. This particular glitch measurement system measures events on a cycle by cycle basis, and a trend analysis is performed. The trend analysis is used to predict incipient failure of the line input, and thus activate an alarm and/or inverter, and feed data to the system Log Buffer.

As transients are detected, they are passed to the first latching counter (114). From there the data is passed into a comparator which momentarily stores d the data. On the second half cycle, the previous data is transferred into the second latching counter (123) where it is remembered. The next transient data set is accumulated and transferred into the first latching counter (114). The comparator then compares the instant reading with the past reading. Sign and magnitude data (117 and 118) is transferred into the trend analyzer (119).

Increasing events, increasing duration, increasing repetition rates and increasing occurrences are determined to indicate a high probability of power line failure. Alarms and data to the Log Buffer is transferred thereto. In a like manner, the trend analysis circuits operate on the glitch data, the voltage out of limits data, and the frequency data.

Inverter Control Logic

FIG. 7 repeats certain elements which are depicted in other sections. Items such as the master clock, hour, day, week, month selector, are repeated here for clarity, and for ease of comprehension.

The first line loss detector: In this part of the system, a sample of input line voltage (V IN), (156) is applied to a RMS detector (155) which converts the input level to a DC level. A simple diode detector and level translator can be used to operate the input of NAND gate (153). The OR gate (139) has inputs from both software control of the inverter or a hard contact in the inverter ON switch to indicate that an inverter is attached to the system. The output of the NAND gate (153) activates the Inverter control module (152). And activates a line loss alarm when the input voltage sample disappears.

The output of the inverter control module is applied to the date and time generator. A totalizer sums the data together and the readout will show both the date and time, and the loss of input power. This is very important for system diagnosis. An inverter connected signal (171) directs the alarm condition to "Need Inverter" alarm, or an inverter ON signal. Time base information controls the counters.

Frequency Measurement

FIG. 8 shows the technique for measurement of incoming line frequency. The system contains two frequency measurement sections. The first measures the input frequency. (If for example, the power input source is a gas generator or windmill, the incoming line frequency may vary out of specification). Under these conditions, the system will switch to inverter operation. A duplicate frequency system measures the output frequency. This information is very useful during diagnostics and troubleshooting. A second frequency counting circuit keeps track of the inverter frequency, and provides data to the system Log Buffer. When the Ferroresonant transformer is used and the inverter is not running, the output frequency is identical to the input frequency. When on inverter, the frequency variation is much less than that allowed for the AC mains. The second frequency measurement is a comparison of the input frequency with an upper and lower limit detector. Simply knowing the input frequency is insufficient for the system control. It is necessary to know when the input frequency exceeds or is less than the assigned limits. Under these adverse conditions, an alarm is sounded. And the inverter is activated. When the system is configured for inverter control as the result of out of frequency tolerances, the inverter option must be included.

The frequency measurement system consists of a zero crossing detector (183), a frequency counter (189) which is activated by a turn on-signal (184) and a turn-off signal (185), which is produced by sequential zero crossings. These pulses are used to trigger a measurement gate in the counter (188) which is proportional to the time for a half cycle. High frequency clock pulses (186) from the time base are injected into the counter during the measurement gate interval, resulting in an accurate frequency measurement.

The output from the counter (188, 189) is stored in a buffer (190) and fed to a frequency display (191). The frequency display buffer is designed to display the line frequency approximately once each second, even though the measurement is taken every cycle, or every 1/60 of a second.

The output of the frequency display (191) is coupled to a comparator (195). The comparator has the allowable frequency limits (196 and 197) pre-programmed into it, and if the frequency limits exceed the upper or lower limits, the inverter is activated, as is the "Out Of Frequency" alarm. Data is also transferred to the system Log Buffers for printout. The comparator (195) provides operating signals for the inverter control (194), the out of frequency limit indicator (199) and the alarm log buffer (200).

FIG. 9 reveals the data Log Buffer and memory circuits. Data from the volts in (201), volts out (205), transients (208), glitch (212), and frequency (216) detect circuits are fed into data log summers. The date (206) and time (207) information is also connected thereto. The selected test interval (227) allows the data in the summers to be transferred into the Log Buffer memory.

All data is stored in the log buffer (220) and can be printed out on a digital printer (223), or observed on a video display (233) at will. Clear (226) and store (225) commands from the main CPU clear the log buffer or synchronize the storage of data. Print commands or video display commands download the data to the appropriate display. Data in the Log Buffer is non volatile and can be erased only when the clear command is activated.

FIG. 10 is another view of the Ferroresonant transformer. Showing the added battery charger winding (245) and the inverter winding (244). The battery charger (240) may be replaced by an external charger if required. The inverter is powered by a battery (243). This circuit is shown for reference only, and is not part of the instant invention.

We claim:

1. A software management system of an intelligent power conditioner with backup system option employing trend analysis for early prediction of AC power line failure, utilizing a microprocessor based control system for providing suitable alarms when an operating input AC line is imminently defective and for initiating an inverter control signal when an inverter module is attached as an option, whereby said control system analyzes the input and output voltages, provides analysis of input voltage surges and sags, measures transient amplitude and transient pulse width, counts glitches, and discontinuities or dropouts, measures frequency, and identifies each defect and computes associated trends, stores all accumulated data in a Log Buffer for digital printout and video display, and then provides appropriate alarms to the user advising of imminent power failure and the need for said inverter module, if said inverter module, which can be attached by simple plug in, has not been attached thereto.

2. The power conditioner of claim 1 whereby a measured defect actuates a visual alarm.

3. The power conditioner of claim 1 whereby a measured defect actuates an audible alarm.

4. The power conditioner of claim 1 whereby accumulated data is stored in a Log Buffer, for printout or visual display by the user.

5. The power conditioner of claim 1 whereby the trend analysis is used to determine incipient power line failure, and thus alert the user that an inverter module is required.

6. The power conditioner of claim 1 whereby the trend analysis system keeps track of battery operation and is used to manage battery recharging for optimum battery life.

7. The power conditioner of claim 3 whereby the audible alarm is a beeper alarm.

8. The power conditioner of claim 3 whereby the audible alarm is a human voice speaking an appropriate message which identifies the determined problem.

9. The power conditioner of claim 5 whereby the inverter module is designed as a plug-in unit, install able by the user.

* * * * *